(12) United States Patent
Siepe et al.

(10) Patent No.: US 8,541,892 B2
(45) Date of Patent: Sep. 24, 2013

(54) BONDING CONNECTION BETWEEN A BONDING WIRE AND A POWER SEMICONDUCTOR CHIP

(75) Inventors: Dirk Siepe, Warstein (DE); Thomas Gutt, Taufkirchen (DE); Roman Roth, Sattendorf (AT)

(73) Assignee: Infineon Technologies AG, Neubiberg (DE)

( * ) Notice: Subject to any disclaimer, the term of this patent is extended or adjusted under 35 U.S.C. 154(b) by 308 days.

(21) Appl. No.: 12/888,781

(22) Filed: Sep. 23, 2010

(65) Prior Publication Data
US 2011/0121458 A1 May 26, 2011

(51) Int. Cl.
*H01L 21/31* (2006.01)
*H01L 21/44* (2006.01)

(52) U.S. Cl.
USPC .......................................... 257/784; 438/617

(58) Field of Classification Search
USPC .......................................... 257/784; 438/617
See application file for complete search history.

(56) References Cited

U.S. PATENT DOCUMENTS

| | | | | |
|---|---|---|---|---|
| 4,845,543 A | * | 7/1989 | Okikawa et al. | 257/738 |
| 4,912,544 A | * | 3/1990 | Onuki et al. | 257/771 |
| 5,101,263 A | * | 3/1992 | Kitano et al. | 257/734 |
| 5,637,274 A | * | 6/1997 | Kitamura | 420/463 |
| 6,066,877 A | * | 5/2000 | Williams et al. | 257/341 |
| 6,140,583 A | * | 10/2000 | Suzuki et al. | 174/68.1 |
| 7,319,196 B2 | | 1/2008 | LeFranc et al. | |
| 7,709,938 B2 | | 5/2010 | Laska et al. | |
| 2001/0009724 A1 | * | 7/2001 | Chen et al. | 428/607 |
| 2004/0163744 A1 | * | 8/2004 | Oishi et al. | 148/667 |
| 2006/0055041 A1 | * | 3/2006 | LeFranc et al. | 257/741 |
| 2008/0054441 A1 | * | 3/2008 | Lin | 257/692 |
| 2008/0122091 A1 | | 5/2008 | Gutt et al. | |
| 2010/0052174 A1 | * | 3/2010 | Bachman et al. | 257/762 |
| 2010/0213613 A1 | | 8/2010 | Laska et al. | |

FOREIGN PATENT DOCUMENTS

| | | | |
|---|---|---|---|
| DE | 102004036142 A1 | | 3/2006 |
| DE | 102004043020 B3 | | 4/2006 |
| DE | 102005028951 A1 | | 12/2006 |
| DE | 102006052202 B3 | | 2/2008 |
| JP | 362070547 | * | 4/1987 |
| WO | WO2010/016306 | * | 2/2010 |

* cited by examiner

*Primary Examiner* — James Mitchell
(74) *Attorney, Agent, or Firm* — Murphy, Bilak & Homiller, PLLC

(57) ABSTRACT

A bonding connection between a bonding wire and a power semiconductor chip is disclosed. The power semiconductor chip has a semiconductor body arranged in which is an active cell region with a multiplicity of cells arranged one following the other in a lateral direction and connected electrically in parallel. The semiconductor body has a surface portion arranged above the active cell region in a vertical direction perpendicular to the lateral direction. Applied to the surface portion is a metallization layer onto which a bonding wire is bonded. The bonding wire comprises an alloy containing at least 99% by weight aluminum and at least one further alloying constituent. The aluminum has a grain structure with a mean grain size which is less than 2 μm.

20 Claims, 4 Drawing Sheets

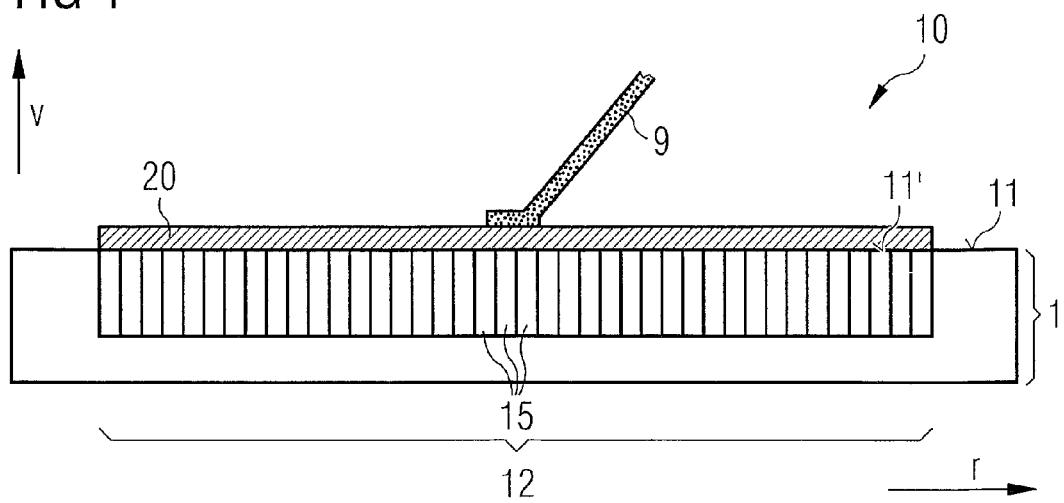
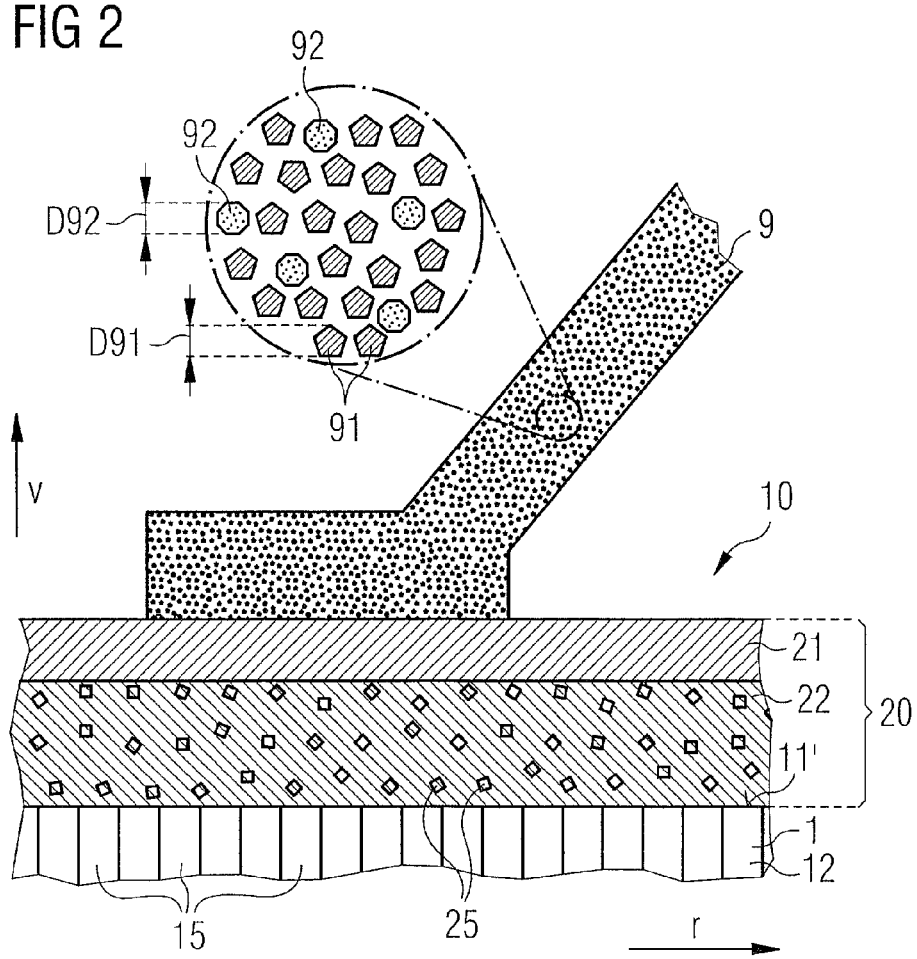

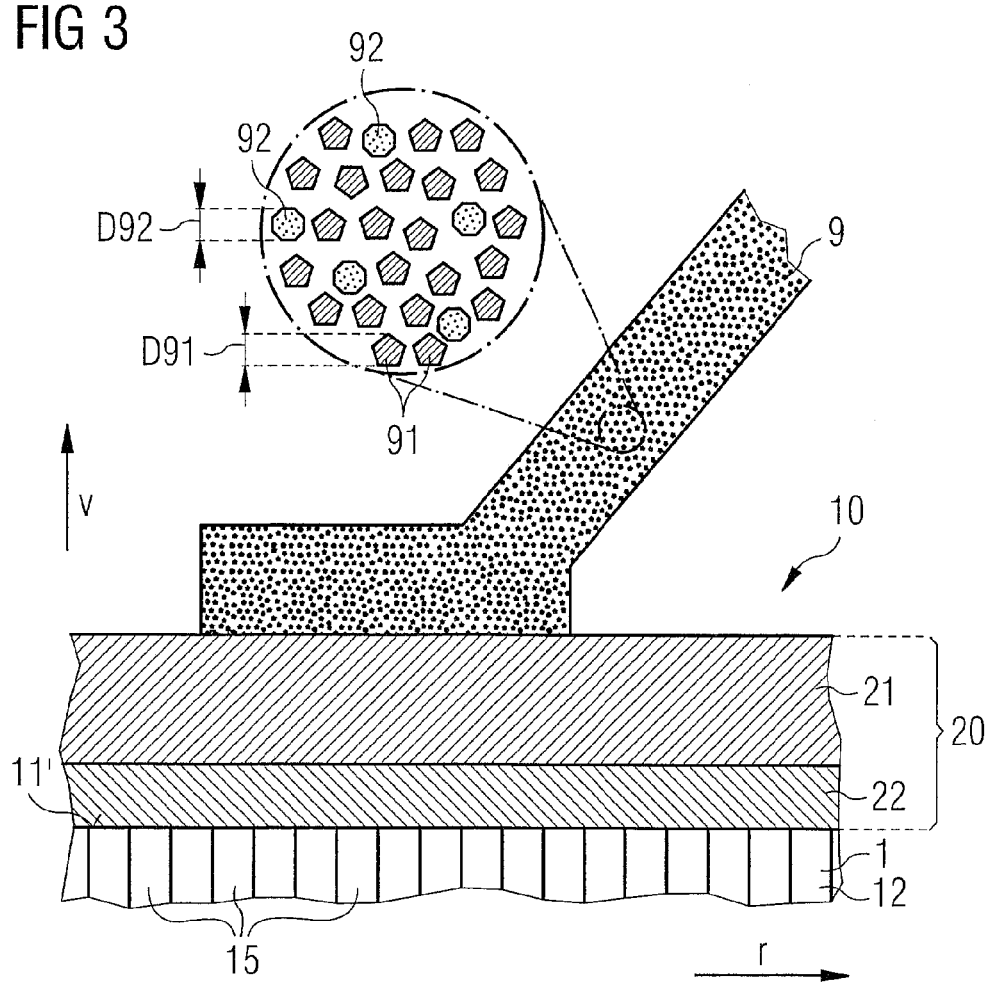

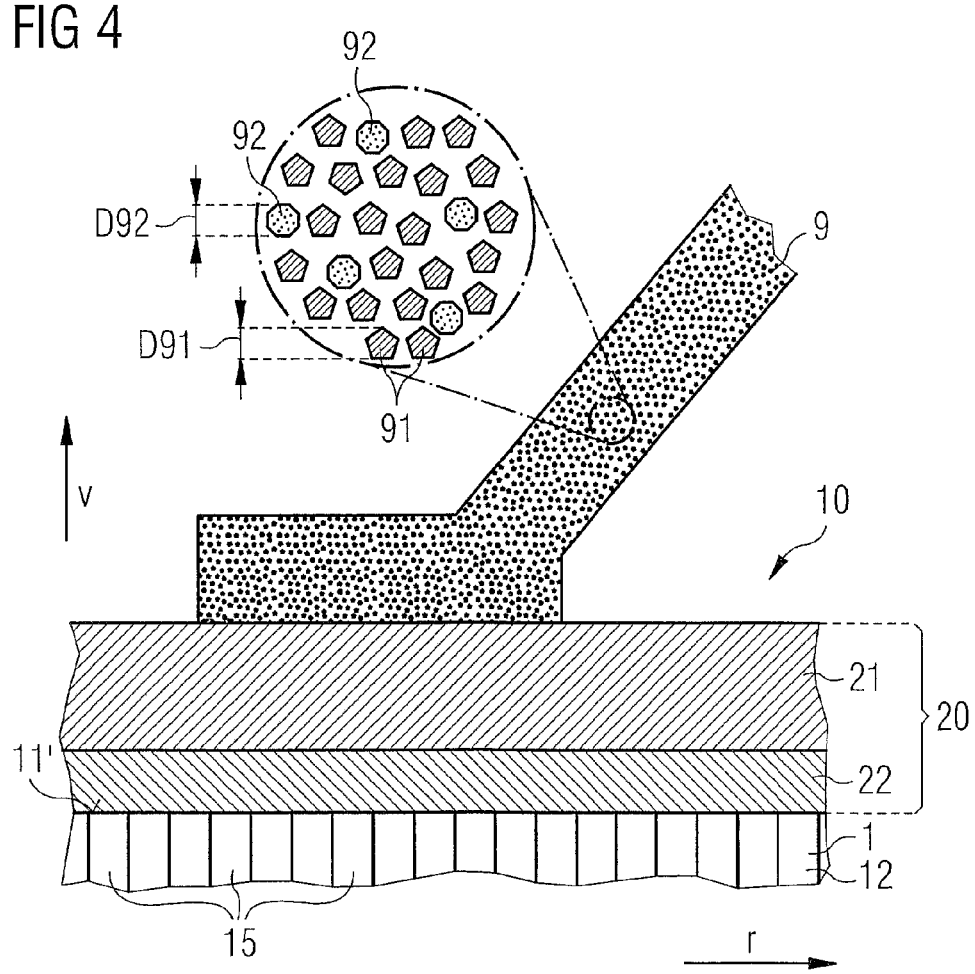

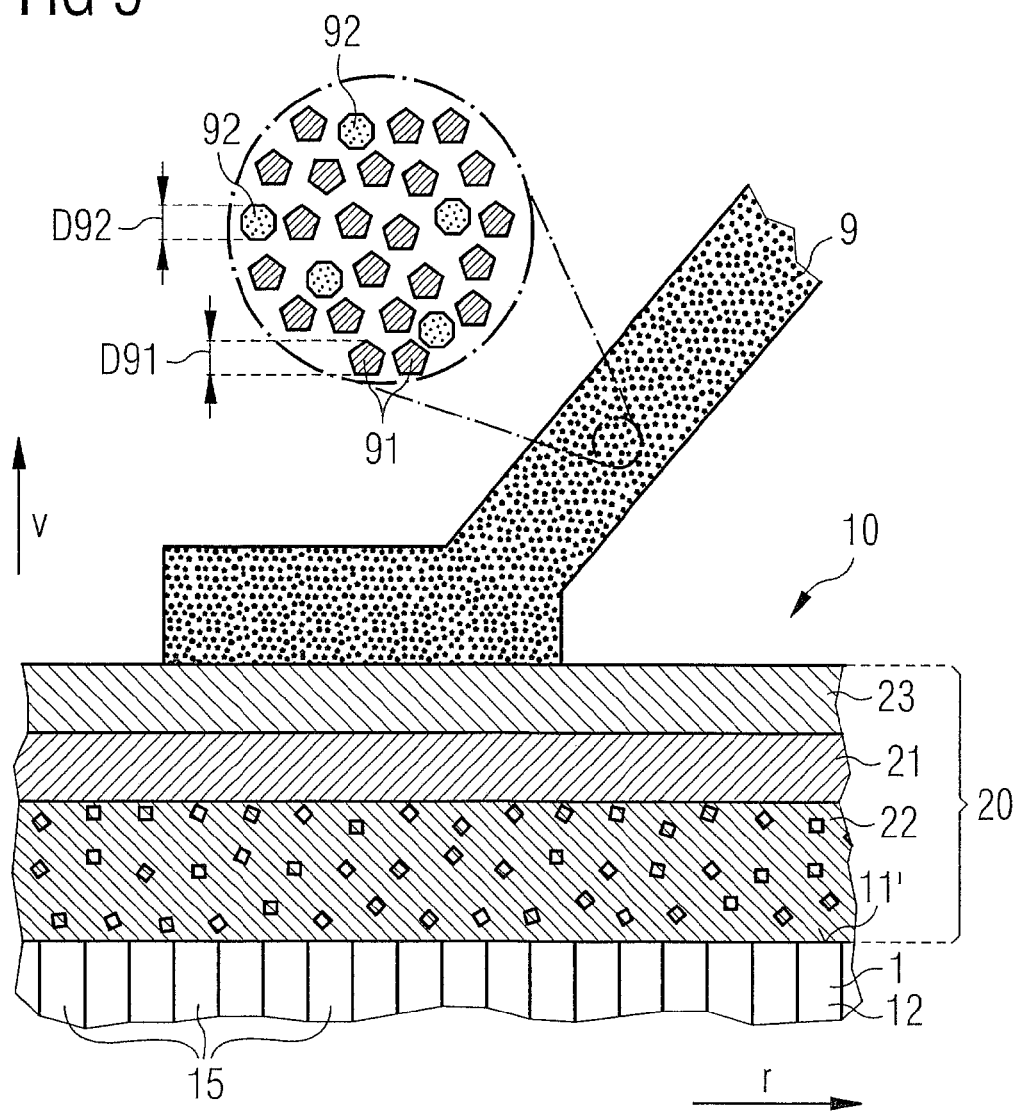

BONDING CONNECTION BETWEEN A BONDING WIRE AND A POWER SEMICONDUCTOR CHIP

PRIORITY CLAIM

This application claims priority from German Patent Application No. 10 2009 045 184.6 filed on 30 Sep. 2009, said German Patent Application incorporated herein by reference in its entirety.

FIELD OF THE INVENTION

The invention relates to a bonding connection between a bonding wire and a power semiconductor chip, and particularly to power semiconductor chips with an upper side having a chip metallization onto which one or more bonding wires can be bonded for the electrical contacting of the power semiconductor chip.

BACKGROUND

During a bonding operation, the bonding wire is pressed with a predetermined pressing force against a chip metallization, in order to achieve an intimate connection between the bonding wire and the chip metallization. However, with increasing diameter of the bonding wire, the pressing force required for this increases and, if the bonding is performed by means of ultrasonic bonding, the ultrasound output required increases. If, however, the power semiconductor chip is a device with an active cell region with a multiplicity of cells connected electrically in parallel, for example a MOSFET (metal-oxide-semiconductor field effect transistor) or an IGBT (insulated gate bipolar transistor), there is the risk with high pressing force and ultrasound output that the cell structure, and with it the power semiconductor chip, will be destroyed if the bonding of very thick bonding wires with a diameter of, for example, more than 100 µm or more than 300 µm is performed above the active cell region.

Therefore, very soft wire materials are typically used for bonding above active cell regions with thick bonding wires, typically of high-purity aluminum with a degree of purity of 99.99% or 99.999%, the microstructure of which is distinguished by large individual grains and a low hardness, for which reason a comparatively low pressing force and ultrasound output are required when bonding. As a result, the active cell region located under the chip metallization is subjected to loading of a lower level during bonding than in the case of harder wire materials.

Since, however, the coefficient of thermal expansion of aluminum differs very greatly from the coefficient of thermal expansion of the semiconductor material, for example silicon or silicon carbide, the bonding connection is exposed to considerable alternating temperature loading when it undergoes frequent temperature changes over large ranges, as occur in particular during switching operation under severe load changes, for example in the case of applications in the traction area. On account of such instances of alternating temperature loading, the contact area between the bonding wire and the chip metallization of the power semiconductor chip is reduced over time, until the bonding wire finally becomes detached from the chip metallization ("lift off"). The lift off problem is becoming more acute as development progresses, leading to ever higher permissible barrier-layer temperatures of the power semiconductor chips, and consequently to higher alternating temperature loading.

To reduce the risk of bonding wire detachment, it has in the past even be acceptable to take costly measures. Such a measure known from DE 10 2005 028 951 A1 is that of sealing the bonding location with polyimide, which however requires an additional cost-intensive process step during the bonding.

Another such measure comprises a bonding process with a large shearing area, as described in the publication of the paper by Siepe and Bayerer: "Time and spatial resolved detection of power device failures during wire bonding" at the CIPS 2006, 4th International Conference on Integrated Power Electronics Systems, Jun. 7 to 9, 2006, Naples/Italy, VDE-Verlag, Berlin, Frankfurt, ISBN 978-3-8007-2972-2. However, this method requires that the chip metallization undergoes a high level of loading and, when bonding above an active cell region, leads to a significant increase in the reject rate. Furthermore, the aluminum bonding wire used recrystallizes due to the high temperature and the alternating temperature loading, and as a result alters its mechanical properties. For example, a thermal treatment for four and a half hours at 190° C. on an aluminum bonding wire with a diameter of 350 µm leads to a reduction in the Martens hardness of about 20%. Furthermore, the breaking load of a pure aluminum bonding wire falls very sharply.

SUMMARY

According to embodiments described herein, a bonding connection is provided between a bonding wire and a power semiconductor chip that allows the use of thick bonding wires and withstands high alternating temperature loading. In the case of such a bonding connection which is produced between a bonding wire and a power semiconductor chip, the power semiconductor chip comprises a semiconductor body in which an active cell region with a multiplicity of cells, for example IGBT or MOSFET cells, are arranged. The cells are arranged one following the other in a lateral direction and connected electrically in parallel. The semiconductor body has a surface portion which is arranged above the active cell region in a vertical direction, perpendicular to the lateral direction.

Applied to the surface portion is a chip metallization layer, onto which a bonding wire is bonded above the active cell region in the vertical direction. This bonding wire consists of an alloy which contains at least 99% by weight aluminum. The aluminum has a grain structure with an average grain size of less than 2 µm. This very small grain size of the aluminum grains is achieved by admixing at least one alloying constituent with the aluminum of the bonding wire. In this context, the grain size of a grain is considered to be the maximum dimension of the grain. The average grain size of the aluminum grains is given by the arithmetic mean of the maximum dimensions of all the aluminum grains of the bonding wire.

The reduction in the average grain size of the aluminum grains in comparison with a high-purity aluminum bonding wire has the effect of increasing the mechanical load-bearing capacity of the bonding connection, so that the plastic deformation of the bonding site decreases, or propagation of a crack that typically runs along grain boundaries is significantly reduced, and the lifetime of the bonding connection is thereby increased. Variation of the average grain size of the aluminum grains allows the aluminum bonding wire to be adapted in such a way that recrystallization at temperatures up to 150° C., up to 175° C., up to 200° C., up to 250° C. or up to 400° C. is prevented or—in cases of thermal exposure for only a short time—at least significantly delayed.

The reduction in the average grain size of the aluminum grains also has the effect of increasing the hardness of the bonding wire. To counteract possibly resultant damage to the active cell region during the bonding operation, it is envisaged to use a chip metallization of adequate strength. The combination of a hard wire with a robust chip metallization prevents the risk of poor bonding yields. A robust chip metallization may be based on the use of a hard metal for the chip metallization.

The chip metallization may in this case have a first sub-layer and a second sub-layer, which is arranged between the first sub-layer and the active cell region on the surface portion.

According to one embodiment, the first sub-layer is harder than the bonding wire.

According to another embodiment, the first sub-layer contains copper or a copper alloy which is harder than the bonding wire, while the second sub-layer may represent a barrier layer, which to the greatest extent prevents diffusion of copper from the second sub-layer into the semiconductor body.

According to yet another embodiment, the first sub-layer contains silicon-free aluminum, while the second sub-layer may represent a barrier layer, which to the greatest extent prevents diffusion of aluminum from the first sub-layer into the semiconductor body.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings:

FIG. 1 shows a vertical section through a power semiconductor chip which has an active cell region, above which a thick bonding wire is bonded onto the chip metallization;

FIG. 2 shows an enlarged portion of a bonding site according to FIG. 1, in the case of which the metallization layer comprises two sub-layers, one of which has a greater hardness than the bonding wire, and another, which is arranged between the one sub-layer and the active region, comprises aluminum doped with silicon;

FIG. 3 shows an enlarged portion of a bonding site according to FIG. 1, in the case of which the metallization layer comprises two sub-layers, one of which comprises a copper or a copper alloy, and another, which is arranged between the one sub-layer and the active region, represents a diffusion barrier for copper;

FIG. 4 shows an enlarged portion of a bonding site according to FIG. 1, in the case of which the metallization layer comprises two sub-layers, one of which consists of pure aluminum, and another, which is arranged between the one sub-layer and the active region, represents a diffusion barrier for aluminum; and FIG. 5 shows an enlarged portion of a bonding site according to FIG. 2, in the case of which a further sub-layer of the metallization layer is arranged between the first sub-layer and the bonding wire.

The directional terminology used in the following description of the figures (for example terms such as "upper", "lower", "left", "right", "front", "rear", "lateral", "on", "under" . . . ) relates to the respective figure. It is merely used for the purpose of making it easier to understand the description of the figures. In principle, the elements shown may be spatially arranged in any way desired, unless the description dictates otherwise. Unless expressly indicated otherwise, the same designations refer to elements that are the same or correspond to one another, with functions that are the same or correspond to one another.

DETAILED DESCRIPTION

FIG. 1 shows a vertical section through a power semiconductor chip 10, which has a semiconductor body 1 with a number of active cells 15, which are arranged one following the other in a lateral direction r and are connected electrically in parallel. The active cells 15 may be, for example, MOSFET or IGBT cells. The active cells are only schematically arranged, since their structure is known in principle to a person skilled in the art.

In a vertical direction v, perpendicular to the lateral direction r, the semiconductor body 1 has an upper side 11 with a surface portion 11', which in the vertical direction v is only arranged above the active cell region 12. Applied to the surface portion 11' is a chip metallization layer 20, onto which a bonding wire 9 is bonded above the active cell region 12 in the vertical direction v. The bonding wire 9 is, in principle, of any diameter desired. The diameter of the bonding wire 9 may, for example, be more than 100 μm or more than 300 μm according to some embodiments. Furthermore, the bonding wire 9 comprises an alloy which contains at least 99% by weight aluminum, and at least one further alloying constituent. The aluminum has a grain structure with an average grain size which is less than 2 μm.

FIG. 2 shows an enlarged portion of an arrangement according to FIG. 1. A portion of the bonding wire 9 is for its part shown further enlarged. It can be seen from the enlarged region of the bonding wire 9 that the bonding wire 9 comprises aluminum, forming grains 91 with grain sizes D91. The term grain size is considered to be the maximum dimension D91 of the grain 91 concerned. The arithmetic mean <D91> of all the aluminum grains 91 of the bonding wire 9 is less than 2 μm, and is determined as follows:

$$\langle D91 \rangle = \frac{1}{N} \cdot \sum_{i=1}^{N} D91(i) \tag{1}$$

where N is the number of aluminum grains 91 of the bonding wire 9 and D91(i) is the maximum dimension of the ith aluminum grain 91.

This low average grain size <D91> is achieved by the bonding wire 9 containing at least one alloying constituent 92. Suitable, for example, as the alloying constituent 92, on their own or in any desired combinations with one another, are Mg, Si, Ti, Cu or Pd, with an overall alloying fraction of, for example, 0.2% by weight to 1% by weight of the bonding wire 9. The bonding wire 9 may, for example, be formed from one of the following materials: AlMg, AlSi, AlTi, AlCu, AlSiCu or AlMgPd.

The chip metallization 20 comprises a first sub-layer 21 of an electrically conducting material, the Martens hardness of which is greater than the hardness of the bonding wire 9. The first sub-layer 21 may, for example, comprise just one or more of the following materials, or consist of just one or more of these materials: Ni, NiB, NiP, CoWB, NiWP, NiWB, NiMoP, NiMoB, NiCoP, NiCoB, NiPd, Cu or a Cu alloy.

Arranged between the first sub-layer 21 and the active cell region 12 is a second sub-layer 22, which may, for example, consist of AlSi, AlSiCu or AlSiTi, or comprise at least one of these constituents, which has an aluminum fraction of more than 90% by weight, and which contains an admixture of 0.2% by weight to 5.0% by weight Si and consequently also silicon precipitates 25.

FIG. 3 illustrates another embodiment where the bonding wire 9 may be constructed in a way similar to the bonding wire 9 shown in FIG. 2. In this embodiment, the first sub-layer 21 contains copper or a copper alloy. This first sub-layer 21 is in turn harder than the bonding wire 9. As an alternative to copper, nickel, gold or platinum for example may also be used, or an alloy with at least one of these metals.

As in the case of the arrangement according to FIG. 2, the second sub-layer 22 is arranged between the first sub-layer 21 and the active cell region 12. The second sub-layer 22 represents a barrier layer, which to the greatest extent prevents diffusion of copper from the first sub-layer 21 into the semiconductor body 1. Suitable, for example, as materials for the barrier layer 22 are TiN, Ta, TaN, TiW or W, alloys or combinations of these layers plus a possible intermediate layer, which may for example assume an adhesive bonding function—with at least one of these materials.

FIG. 4 illustrates another embodiment with a further possibility of increasing the yield in bonding is explained. Here, a chip metallization 20 with a first sub-layer 21 of Al, AlCu, AlTi or an alloy with at least one of these substances which is free from silicon precipitates is used. Silicon, and consequently also silicon precipitates, are usually introduced into aluminum or aluminum-containing alloys in order to avoid the occurrence of harmful "Al spiking" in the semiconductor body. "Al spiking" occurs when aluminum from the chip metallization 20 and Si from the semiconductor body 1 interchange, and consequently a pn junction in the Si may be destroyed. The silicon precipitates have the effect that the aluminum is bound to a certain degree in the metallization 20, whereby the diffusion of aluminum into the semiconductor body 1 is reduced. However, silicon precipitates represent one of the main causes of failure in bonding, so that the quality of a bonding connection can be improved by omitting these silicon precipitates. However, it is then advantageous to provide between the first sub-layer 21, which is free from silicon precipitates, and the semiconductor body an optional second sub-layer 22, which largely prevents the diffusion of aluminum into the semiconductor body 1.

Generally suitable for barrier layers 22 are those materials in which the substance of which the diffusion into the semiconductor body 1 is to be reduced by the barrier layer 22. To be able to overcome a barrier layer 22, the substance must have a certain minimum energy, known as the activation energy. This activation energy depends on the substance itself, the material of the barrier layer 22, and on the thickness thereof. It is consequently advantageous, in the case of a given substance, for example aluminum, and a given material of the barrier layer 22, to choose the thickness of the barrier layer such that the required activation energy is greater than the major part of the particle energies occurring in the substance during the lifetime of the device. In the case of an assumed lifetime of 15 years, the required activation energy to penetrate the barrier layer 22 may be, for example, 0.9 eV. Suitable, for example, as materials for the barrier layer 22 in the case of the embodiments of FIGS. 3 and 4 are TiN, Ta, TaN, TiW or W, or alloys with at least one of these materials.

In the case of all of the embodiments described herein, the bonding wire may directly contact the first sub-layer 21. As an alternative to this, as shown in FIG. 5, a further, third sub-layer 23 of the chip metallization 20 may also be applied to the first sub-layer 21. Such a third sub-layer 23, which is then arranged between the bonding wire 9 and the first sub-layer 21, may be, for example, an oxidation protection layer, with which the next sub-layer lying thereunder of the chip metallization 20, e.g. in FIG. 5 the first sub-layer 21, is protected from oxidation. This allows a greater strength of the bonding connection to be achieved, since an oxide surface on a metallization to be connected with a bonding wire has disadvantageous effects on the quality of the bonding connection. In principle, such a third sub-layer 23 may, however, also undertake other functions, for example protection from a chemical which is used in the processing of the power semiconductor chip. Suitable, for example, as materials for such a third sub-layer 23 are Au, Pt, Pd, Ag or Ni, or alloys with at least one of these metals.

According to the embodiments described herein, it is possible to dispense with special measures such as bonding wire sealing. As such, the additional costs involved are well below those for bonding wire sealing. Nevertheless, bonding wire sealing may of course be additionally provided. Furthermore, a further improvement in the resistance to alternating loading can be achieved in comparison with bonding-wire-sealed modules. Also, the robust metallization is not accompanied by any change in the electrical parameters of the chips, so that productive chips can also be converted in a simple manner.

The embodiment shown in FIG. 2 was tested on IGBTs under a barrier voltage of 1.2 kV and 6.5 kV in conjunction with a bonding wire of AlMg 0.5% (i.e. 99.5% by weight Al and 0.5% by weight Mg) and a diameter of 400 μm. The robust first sub-layer 21 was an electrolessly deposited nickel layer and the second sub-layer 22 was an AlSiCu chip metallization. Layer thicknesses of the first sub-layer 21 and the second sub-layer 22 were chosen to be approximately the same. In the case of a parallel test series with a conventional bonding connection, fifteen gate-emitter failures occurred and six IGBTs were completely destroyed during the bonding. By contrast, in the case of the test series with the bonding connection according to the embodiments described herein, there was not a single failure. The number of pieces tested in each of both test series was 100.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor arrangement comprising a bonding connection between a bonding wire and a power semiconductor chip, the power semiconductor chip including a semiconductor body arranged in which is an active cell region with a multiplicity of cells arranged one following the other in a lateral direction and connected electrically in parallel, wherein:
   the semiconductor body has a surface portion arranged above the active cell region in a vertical direction perpendicular to the lateral direction;

applied to the surface portion is a metallization layer onto which a bonding wire is bonded;

the bonding wire comprises an alloy containing at least 99% by weight aluminum and at least one further alloying constituent; and the aluminum has a grain structure with a mean grain size less than 2 μm.

2. The power semiconductor arrangement as claimed in claim 1, wherein the metallization layer has a first sub-layer and a second sub-layer arranged between the first sub-layer and the active cell region on the surface portion.

3. The power semiconductor arrangement as claimed in claim 2, wherein the first sub-layer directly contacts the second sub-layer.

4. The power semiconductor arrangement as claimed in claim 2, wherein the first sub-layer has a hardness greater than a hardness of the bonding wire.

5. The power semiconductor arrangement as claimed in claim 4, wherein the first sub-layer comprises at least one of the following materials, or an alloy with one or more of the following materials: Ni, NiB, NiP, CoWB, NiWP, NiWB, NiMoP, NiMoB, NiCoP, NiCoB, NiPd, Cu and a Cu alloy.

6. The power semiconductor arrangement as claimed in claim 2, wherein the second sub-layer comprises aluminum having 0.2% by weight to 5.0% by weight silicon precipitates.

7. The power semiconductor arrangement as claimed in claim 2, wherein the first sub-layer comprises Al, AlCu, AlTi or an alloy with at least one of Al, AlCu, and AlTi and is free from silicon precipitates.

8. The power semiconductor arrangement as claimed in claim 2, wherein the second sub-layer is formed as a barrier layer.

9. The power semiconductor arrangement as claimed in claim 8, wherein a thickness of the second sub-layer is such that an activation energy associated with a diffusion of particles of the first sub-layer through the second sub-layer is at least 0.9 eV.

10. The power semiconductor arrangement as claimed in claim 9, wherein the thickness of the second sub-layer is such that an activation energy associated with a diffusion of copper and/or aluminum through the second sub-layer is at least 0.9 eV.

11. The power semiconductor arrangement as claimed in claim 8, wherein the second sub-layer comprises one of the following materials or of an alloy with one of the following materials: TiN, Ta, TaN, TiW and W.

12. The power semiconductor arrangement as claimed in claim 11, wherein the bonding wire is formed from one of the following materials: AlMg, AlSl, AlTi, AlCu, AlSiCu and AlMgPd.

13. The power semiconductor arrangement as claimed in claim 1, wherein the at least one further alloying constituent comprises one or more of the following substances: Mg, Si, Ti, Cu, Si and Pd.

14. The power semiconductor arrangement as claimed in claim 1, wherein the bonding wire directly contacts the first sub-layer.

15. The power semiconductor arrangement as claimed in claim 1, wherein the metallization layer comprises a third sub-layer arranged between the bonding wire and the first sub-layer in the vertical direction.

16. The power semiconductor arrangement as claimed in claim 15, wherein the bonding wire directly contacts the third sub-layer.

17. The power semiconductor arrangement as claimed in claim 1, wherein the bonding wire has a diameter of more than 100 μm.

18. The power semiconductor arrangement as claimed in claim 17, wherein the bonding wire has a diameter of greater than or equal to 300 μm.

19. The power semiconductor arrangement as claimed in claim 1, wherein the bonding wire is unsealed.

20. The power semiconductor arrangement as claimed in claim 1, wherein the power semiconductor chip is a MOSFET or an IGBT, and in which the cells are cells of a MOSFET or of an IGBT.

* * * * *